US011398819B2

(12) United States Patent
Hamer et al.

(10) Patent No.: US 11,398,819 B2
(45) Date of Patent: Jul. 26, 2022

(54) SWITCH NETWORK HOUSING

(71) Applicant: AIRBUS DEFENCE AND SPACE LIMITED, Stevenage (GB)

(72) Inventors: Maurice Joseph Hamer, Portsmouth (GB); Simon Rumer, Stevenage (GB); Ian Morris, Portsmouth (GB); Oilid Bouzekri, Stevenage (GB)

(73) Assignee: AIRBUS DEFENCE AND SPACE LIMITED, Hertfordshire (GB)

(*) Notice: Subject to any disclaimer, the term of this patent is extended or adjusted under 35 U.S.C. 154(b) by 410 days.

(21) Appl. No.: 16/086,072

(22) PCT Filed: Mar. 16, 2017

(86) PCT No.: PCT/GB2017/050722
§ 371 (c)(1),
(2) Date: Sep. 18, 2018

(87) PCT Pub. No.: WO2017/158361
PCT Pub. Date: Sep. 21, 2017

(65) Prior Publication Data
US 2020/0295754 A1   Sep. 17, 2020

(30) Foreign Application Priority Data
Mar. 18, 2016  (GB) ..................................... 1604609

(51) Int. Cl.
*H01P 3/00*  (2006.01)
*H03K 17/56*  (2006.01)
(Continued)

(52) U.S. Cl.
CPC ............... *H03K 17/56* (2013.01); *H01P 3/00* (2013.01); *H04L 49/25* (2013.01); *H05K 5/0217* (2013.01)

(58) Field of Classification Search
CPC ........... H03K 17/56; H01P 3/00; H04L 49/25; H05K 5/0217
See application file for complete search history.

(56) References Cited

U.S. PATENT DOCUMENTS 4,237,431 A * 12/1980 Shishido ................. H01P 1/122
                                                                333/106
5,053,732 A * 10/1991 Elgass ...................... H01P 1/122
                                                                333/106
(Continued)

FOREIGN PATENT DOCUMENTS

JP              62262501 A        11/1987

OTHER PUBLICATIONS

International Search Report and Written Opinion for PCT/GB2017/050722 dated May 30, 2017.
(Continued)

*Primary Examiner* — Dinh T Le
(74) *Attorney, Agent, or Firm* — FisherBroyles, LLP; Robert Kinberg

(57) ABSTRACT

A housing for a switch network is provided, comprising a plurality of switch blocks, each of the switch blocks being adapted to receive a radio frequency switch, and one or more interlink waveguides. At least one of the waveguides is arranged to connect a respective two or more of the switch blocks to each other and arranged externally with respect to the two switch blocks. At least one of the one or more waveguides is integrally formed with at least one of the switch blocks. A method of manufacturing the housing is also provided.

10 Claims, 2 Drawing Sheets

(51) Int. Cl.
*H04L 49/25* (2022.01)
*H05K 5/02* (2006.01)

(56) References Cited

U.S. PATENT DOCUMENTS

| | | | |
|---|---|---|---|
| 5,155,456 A | 10/1992 | Ruff et al. | |
| 5,222,162 A * | 6/1993 | Yap | G02B 6/12004 |
| | | | 385/14 |
| 8,587,386 B2 * | 11/2013 | Hauff | H01P 1/122 |
| | | | 333/106 |
| 9,397,379 B2 * | 7/2016 | Kroening | H01P 1/39 |
| 9,470,713 B2 * | 10/2016 | Zelder | G01R 31/00 |

OTHER PUBLICATIONS

Written Opinion for PCT/GB2017/050722 dated Feb. 9, 2018.
International Preliminary Report on Patentability for PCT/GB2017/050722 dated May 29, 2018 (submitted without annexes).
Search Report dated Aug. 24, 2016 for Great Britain Patent Application No. GB 1604609.6.
Erik G. Geterud, et al., "Lightweight Waveguide and Antenna Components Using Plating on Plastics", 2013 7th European Conference on Antennas and Propagation (EuCAP), 2013, IEEE, pp. 1812-1815, XP 32430364A.

* cited by examiner

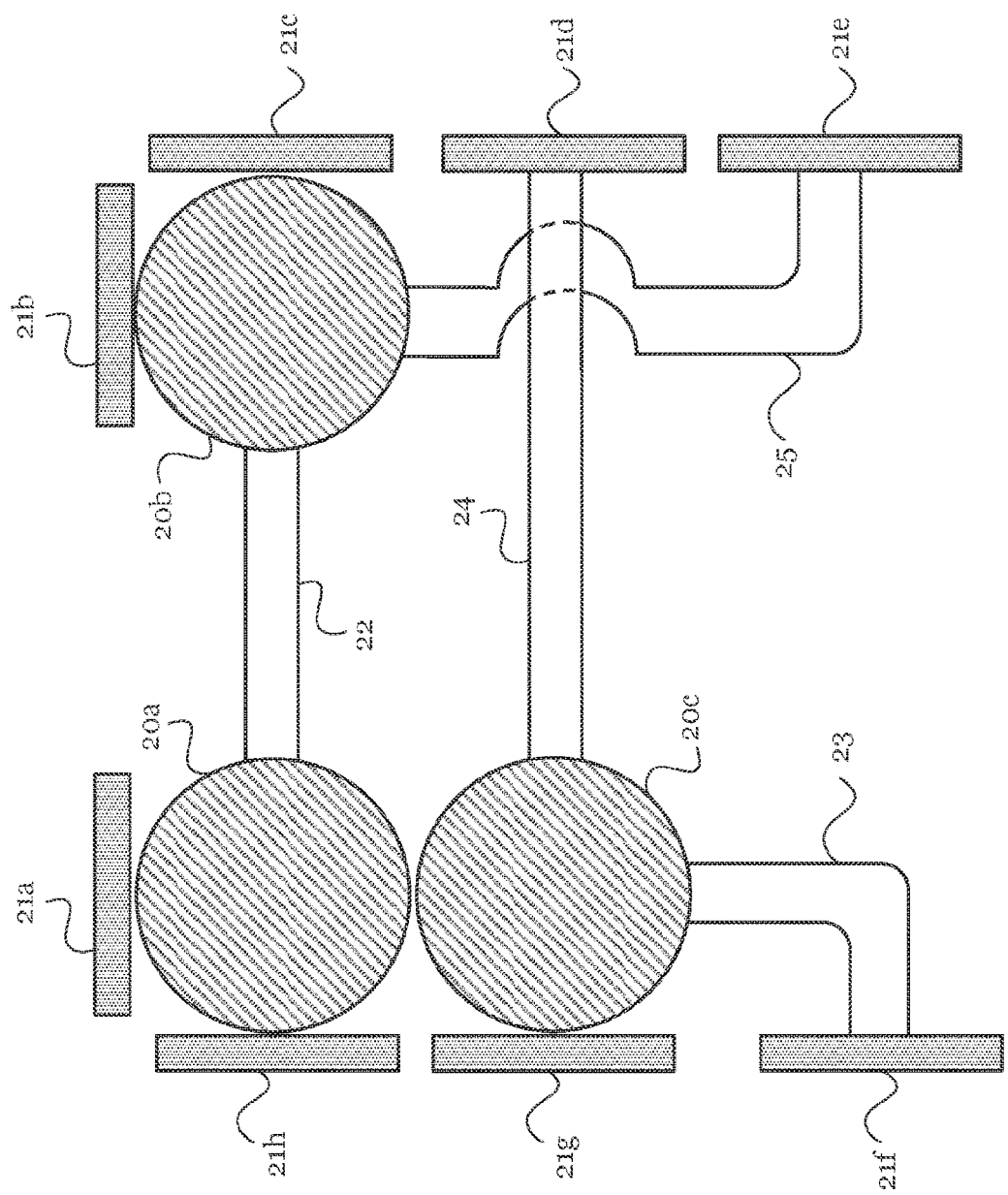

SWITCH NETWORK HOUSING

CROSS-REFERENCE TO RELATED APPLICATIONS

This application is a U.S. National Stage of International Patent Application No. PCT/GB2017/050722 filed Mar. 16, 2017 designating the United States and claiming benefit of United Kingdom Patent Application No. 1604609.6 filed Mar. 18, 2016.

TECHNICAL FIELD

The present invention relates to housing for a switch network, and particularly, but not exclusively, to the design and manufacture of a waveguide switch network for radio frequency (RF) signals.

BACKGROUND ART

Signal switching is a commonly used technique in a variety of applications. Switching is performed to select the path, from among a number of available paths, through which a signal is to pass. In a satellite payload, for example, a switch network is used to control routing of signals through a variety of different paths to ensure signal communication through a desired set of hardware components to meet operational requirements.

Waveguides are commonly used in a wide range of applications, for guiding a wave along a desired path. For example, in a communications satellite, it may be necessary to pass a received microwave signal through a number of components (e.g. amplifiers, filters, multiplexers) before retransmitting the processed signal. In this case, an electromagnetic waveguide may be used to carry the signal from one component to the next.

Waveguides are particularly used to carry signals between switches in an RF switch network. In such a system, signal routing is controlled via a specially configured waveguide switches. A waveguide switch has a plurality of signal ports, typically four (for example, ports #1, #2, #3, and #4). The waveguide switch operates to define the signal path which is to be taken by an RF signal entering the switch at a particular port. The switch provides links between pairs of ports, such as a link between port #1 and port #2, and a link between port #3 and port #4, so that a signal input to port #1 exits the switch at port #2, and a signal input to port #3 exits the switch at port #4. On changing the position of the switch, the waveguide switch can be controlled to provide links between port #2 and port #3, and between port #4 and port #1, changing the signal routing. Consequently, the signal path to be taken by a particular switch can be controlled by the configuration of the wave guide switch.

Waveguide switches are typically cylindrical or cuboidal components having their signal ports distributed about the circumference of a switch body, and a an RF rotor which fits within the switch body to control the switching position, based on rotation between different states. As such, there is a design constraint to be applied to the design of the switch network such that waveguides which couple the switches together are compatible with the size and spatial distribution of the ports.

For complex switch networks, this design constraint has the effect that long waveguides may be required to connect switches together, in order to ensure that all of the required signal paths for the system and the associated switches can be accommodated physically. Conventional manufacturing processes also impose constraints on the freedom of the designer of the switch network because complex waveguides have tight mechanical tolerances in order to achieve the desired RF performance, and so it must be ensured that the waveguide can be physically constructed in a manner which enables such performance to be achieved. For example, the attachment of a waveguide to a switch should be performed in a manner which minimises signal loss and signal reflection at the point of coupling, and therefore ease of access to the point of coupling is desirable to enable assembly tools to be applied appropriately to the waveguide and the switch.

To achieve the above ease of access, switch network components are typically constructed separately and then assembled so that the assembly process can be performed in a manner which ensures that the required system tolerances are met. For example, switch blocks and waveguides are constructed separately and are then coupled together in an assembly process using bolts, screws, clamps and the like.

It may therefore be the case that the entire switch network housing can be large and heavy to achieve the required performance, including long waveguides and using a large number of coupling and mounting components. In certain applications, particularly satellite applications, this is disadvantageous since spatial and weight constraints can be significant where the switch network is to be used in the electronics of a satellite payload.

The present invention aims to provide an improved housing for a switch network, and a method of manufacturing of a housing for a switch network.

SUMMARY OF INVENTION

According to an aspect of the present invention there is provided a housing for a switch network, comprising a plurality of switch blocks, each of the switch blocks adapted to receive a radio frequency switch, and one or more waveguides, at least one of the waveguides arranged to connect two or more of the switch blocks to each other, wherein at least one of the waveguides are integrally formed with at least one of the switch blocks.

Through designing a waveguide switch network with integral waveguide interconnecting structures, the physical size of a switch network can be considerably reduced, and fewer component parts are required for a given switch network. The switch network is thus more suitable for environments such as space.

Two or more of the switch blocks may be arranged in different orientations from each other, optimising the spatial configuration.

The projections of two of the waveguides onto a surface may intersect, optimising the spatial configuration.

Each of the switch blocks may be integrally formed with a mounting bracket, in which the mounting bracket may be integrally formed with a base, providing mechanical stability in a manner which optimises the manufacturing the housing as a whole.

The interface, between a waveguide and a switch block may occur at a switch block port, and the ports of each of the switch blocks may be in a common plane which is parallel to the plane of the base.

One or more of the waveguides may be arranged to connect a switch block to an interface of the housing. This ensures that the benefits of integrating waveguides with switch blocks extends to the interface of the switching network to be housed.

According to another aspect of the present invention, there is provided a satellite payload comprising the above housing.

According to another aspect of the present invention, there is provided a switch network comprising the above housing and a plurality of radio frequency switches respectively contained in the plurality of switch blocks, the switches arranged to route radio frequency signals selectively through the network.

According to another aspect of the present invention, there is provided a method of manufacturing a housing for a switch network, comprising forming a plurality of switch blocks adapted to receive a radio frequency switch, and forming one or more waveguides, at least one of the waveguides arranged to connect two or more of the switch blocks to each other, wherein at least one of the one or more waveguides is formed integrally with at least one of the switch blocks.

Through manufacturing a waveguide switch network with integral waveguide interconnecting structures, the physical size of a switch network can be considerably reduced, and fewer component parts are required for a given switch network. The switch network is thus more suitable for environments such as space.

The integral formation of the one or more waveguides and the plurality of switch blocks may use additive layer manufacturing, a technique appropriate for the repeatable automated manufacture of complex structures.

BRIEF DESCRIPTION OF DRAWINGS

Embodiments of the present invention will be described by way of example only, in which:

FIG. 2 illustrates a functional view of a switch network housing according to an embodiment of the present invention.

DESCRIPTION OF PREFERRED EMBODIMENTS

Figure 1:
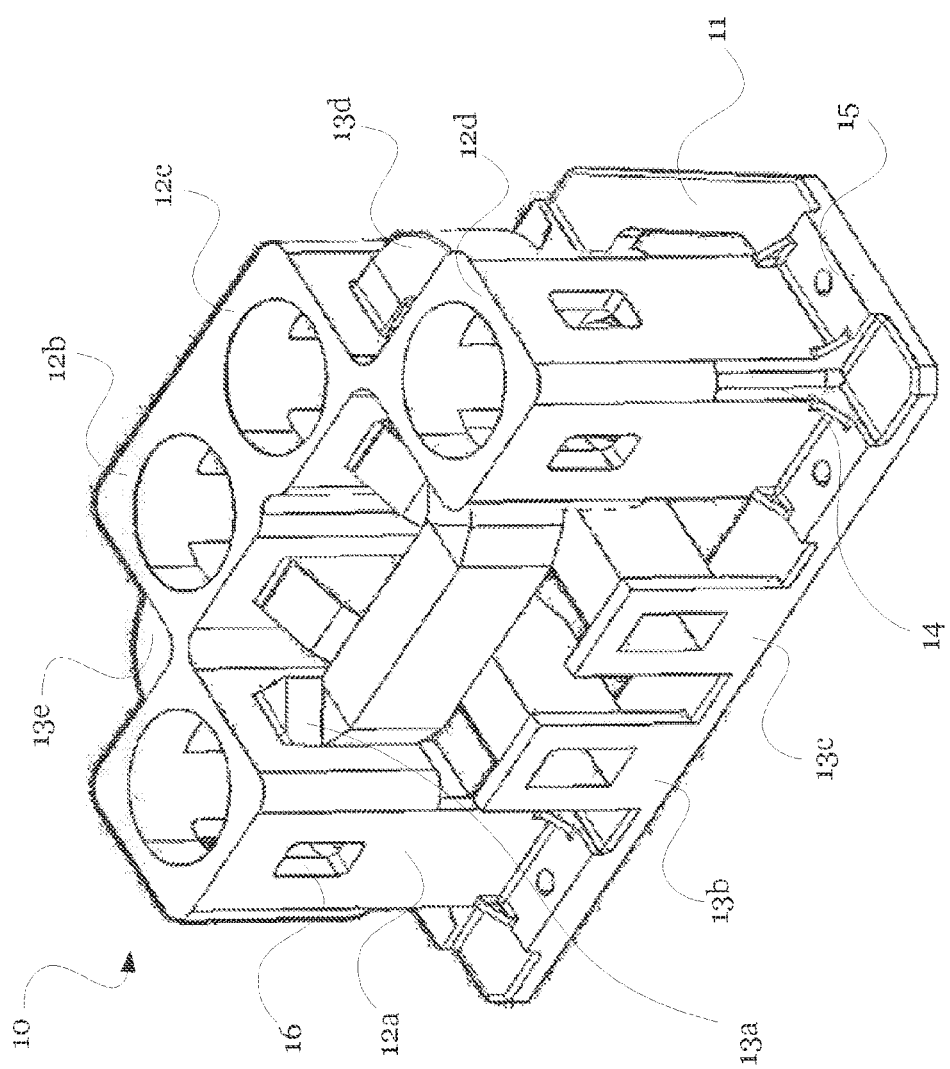
FIG. 1 illustrates an isometric view of a housing according to an embodiment of the present invention.

FIG. 1 illustrates an isometric view of a housing 10 according to an embodiment of the present invention. The housing 10 comprises a base 11, a plurality of RF switch blocks 12a-d, a plurality of hollow waveguides 13a-e, and a plurality of mounting brackets 14 and feet 15.

The RF switch blocks 12a-d are substantially hollow components which are adapted to receive a corresponding plurality of waveguide switches. The switch blocks 12a-d are of a size which is suitable for use with an intended type of waveguide switch. For example, the switch blocks 12a-d may contain a circular hollow section designed to receive a stator of a waveguide switch of a particular size. Each switch block 12a-d contains one or more signal ports 16 which are designed to interface with the ports of the corresponding waveguide switch which is to fit in the switch block. Each switch block 12a-d is mounted to a base 11 of the housing 10 via mounting brackets 14 and feet 15.

The waveguides 13a-e of the embodiment of FIG. 1 are categorised as interlink waveguides and interface waveguides. Interlink waveguides are referred to in the present disclosure as waveguides which connect two switch blocks together, and three examples 13a, 13d and 13e are illustrated in FIG. 1. Two interface waveguides 13b, 13c are also illustrated which connect switch blocks 12b, 12c to waveguide flanges, which represent interfaces between the housing 10 and components external to the housing 10, such as an input/output module of a signal processing system, or a signal amplifier. The interface is achieved via connection of flanges to a corresponding flange on an external component.

FIG. 2 illustrates a functional diagram of an example of a switch network housing according to an embodiment of the present invention. FIG. 2 illustrates three switch blocks 20a-c adapted to receive cylindrical waveguide switches. In the present embodiment, each switch block 20a-c has four ports, evenly distributed around the cross-sectional circle of the hollow volume of the switch block intended to receive the waveguide switch.

The switch network housing of the embodiment of FIG. 2 has eight signal interface ports 21a-h. These interface ports 21a-h represent points of entry or exit of a signal to or from the switch network, and signals at any of the eight ports 21a-h may be routed to any of the other eight ports 21a-h by an appropriate combination of waveguide switch positions when the waveguide switches are added to the respective switch blocks.

The housing of FIG. 2 illustrates one interlink waveguide 22 coupling switch blocks 20a and 20b, and three interface waveguides 23, 24, 25 coupling switch blocks 20b and 20c to waveguide flanges at ports 21d, 21e and 21f as shown. A portion of waveguide 25 is illustrated in dotted lines to reflect routing of that section of waveguide 25 under waveguide 24.

It will be clear from the switch blocks of FIG. 2, and also from the embodiment of FIG. 1, that it is not essential for each switch block of the invention to be connected to another switch block via an interlink waveguide. Two switch blocks 20a, 20c may be adjacent, for example, in which case signal communication can be achieved through respectively aligned signal ports in the adjacent switch blocks. It is also possible for two switch blocks 20b, 20c to be connected only indirectly, through one or more other switch blocks. The exact switch network which is used, in terms of the number of ports, waveguide switches and waveguides, is determined by the functional requirements of the system.

It will also be clear that it is not essential for a switch network to have four switches or four ports per switch, and that the principles of the invention apply to a housing for any appropriate switch network configuration.

In the embodiments of the present invention, the switch blocks and the waveguides are integrally formed. It is also possible for the base and/or mounting brackets and/or feet to be integrally formed with the switch blocks and the waveguides but in other embodiments, the base and/or mounting brackets and/or feet may be separate components from the housing which are coupled with the switch block and waveguide sections via bolts, screws, clamps and the like.

In one embodiment, the integral formation is achieved via additive layer manufacturing (ALM). The overall design of the switch network housing is provided as a configuration file to ALM hardware, which constructs the housing through deposition of successive layers of material, such as plastic or other non-metallic materials such as polymers, ceramics or resin-based materials.

Each layer of the housing represents an integrally formed structure of material used in the ALM process. Consequently it is possible to ensure that all connections between waveguides and switch blocks are formed using a single piece of material, which leads to a number of advantages as set out below.

It is possible for the overall size of the housing, and the number of components, to be reduced compared with conventional switch network housings. Since the switch blocks and waveguides are integrally formed, it is not necessary to use assembly tools, for example, a screwdriver, or mechanical bolts to connect the waveguides and the switch blocks to each other. Consequently, the entire housing package can be structured more tightly, since no ease of access needs to be built into the design to ensure that such connections can be performed. Through reducing the size of the housing, the weight and the number of components (such as supporting brackets) can be reduced.

The avoidance of design constraints which would conventionally be imposed by requiring ease of access provides further flexibility in the design of the housing because it is possible for the switch blocks and waveguides to be arranged in a larger number of orientations than would be conventionally possible, in order to further optimise use of space. In the embodiment of FIG. 2, all of the switch blocks 20a-e are illustrated as having their cross-section in the same plane, but the present invention is not limited to this embodiment, and it would be possible to construct a switch network housing falling within the scope of the invention which contains switch blocks in two or more different three-dimensional orientations which are integrally formed with the waveguides. In this example, the interlink and interface or flange waveguides would be able to achieve the necessary connections through routing over, around and under the switches and other wave guides. Such routing of waveguides can be seen as the intersection or overlap of the projection of two waveguides onto a surface, such as the base of the housing.

Spatial optimisation could, for example, be achieved by positioning the switch blocks such that the shortest possible total length of interlink waveguides is required, or so that the housing contains the largest possible number of adjacent switch blocks. Alternatively, or additionally, spatial optimisation could be performed by arranging the signal ports of different switch blocks in different planes through adjustment of the height of a switch block from the base, using spacers or the like. In other embodiments, however, it will be appreciated that it may be desirable to ensure that the signal ports are in a common plane, for example a plane parallel to the base, since this might in some circumstances simplify the overall design, reducing the number of bent sections in the waveguides, or the suitability for packaging the switch housing in external casing. Such casing might comprise electromagnetic shielding, for example, where the switch network is to be used in space.

Although ALM is described above as an example of a technique which could be used in the manufacture of the housing according to the present invention, this is not the only possible technique which can be used. Any technique in which integral waveguide and switch block structures can be made is appropriate to the present invention. The method of manufacture of the invention can be summarised by the steps of 1) forming a plurality of switch blocks adapted to receive an RF switch, and 2) forming one or more waveguides, at least one of the waveguides being an interlink waveguide arranged to connect two or more of the switch blocks to each other, wherein the one or more interlink waveguides are formed integrally with the plurality of switch blocks.

Alternative fabrication processes may include other types of additive manufacturing which are not performed in layers, extrusion, etching or moulding steps.

Such techniques are conventionally used for bulk components where design tolerances are large. These techniques have not traditionally been used for smaller or high-precision components as the nature of the process, and the materials used, have not generally been seen as suitable for thin or delicate structures, such as standalone waveguides. The present invention involves the realisation that it is in fact possible to achieve the required performance level for a switch network using a technique for manufacturing the switch network housing such as ALM, because it becomes possible to optimise the overall design of the housing, in terms of the orientation, size or distribution of the switch blocks and waveguides, such that the performance of the switch network can be achieved while at the same time reducing the spatial extent and the weight of the network.

For example, a switch network dissipates power in operation as signals and their associated energy pass through the structural components such as the waveguides and the switch networks. Depending on the shape or curvature of the waveguides, and the likely signal traffic through particular waveguides or switches, different areas of the switch network may dissipate different levels of power. Conventionally, where system design has been driven by the constraint that assembly of the components of the switch network housing is facilitated, this can lead to a reduction in overall efficiency due to the thermal dissipation in certain areas of the network, dissipation deemed to be the acceptable cost of facilitating construction.

Particularly in cases where a switch network is intended to be used in space, for example, in a satellite, thermal power dissipation can be a particular problem due to the associated complexities associated with cooling and temperature control in that environment. As such, a switch network manufactured according to conventional techniques can have sub-optimal design for particular environments. Where design freedom is increased by integrating the waveguides and the switch blocks, however, it is possible to perform thermal optimisation prior to manufacture of the housing, through appropriate simulation and design of the switch network. For example, it might be found that thermal performance can be improved by changing the orientation of a switch block.

Similar considerations apply in respect of mechanical optimisation, where simulations can be performed to ensure the mechanical strength of a system, through optimising the overall design of a switch network while avoiding structures which might be associated with particular stress, such as tightly twisted waveguides.

In some embodiments, where appropriate, it is possible to manufacture a portion of a switch network housing using the techniques described above, and to use other manufacturing techniques for another portions of the housing. In some configurations, a portion of the switch network housing design may either be relatively complex, or may not allow easy access by assembly tools, and so the integral formation techniques described above are appropriate for these portions. Other portions of the switch network housing design may allow for greater access by assembly tools. For example, some housing portions may require a lower concentration of waveguides or switch blocks, and here it may be possible to assemble components via bolts, screws and the like. As such, in some embodiments it is not essential for the entire housing to be integrally formed.

In summary, the design of an integrally formed switch network housing can be an organic process in which the housing as a whole is specifically designed to be optimal for a particular scenario, rather than being assembled from a number of separate standardised components.

Although the embodiments of the present invention have been described in connection with RF signal switch networks, the principles of operation of the present invention can be applied to other fields. For example, a switch network might be used in the context of fluid dynamics, in which fluids can be selectively routed through particular pathways to achieve a particular effect. Examples of such applications might be in air conditioning units, or in directional propulsion systems. In such situations, a switch network housing can be manufactured according to the technique of the present invention, with appropriately dimensioned integrated tubing and switch block sections. The switch network design in such cases will take into account various parameters associated with fluid dynamics, such as pressure, viscosity and flow rate associated with various sections of the network, and so performance can be optimised through appropriate spatial configuration of integral tubing and switch combinations.

The skilled person will therefore appreciate that the specific design of a particular housing is dependent on the specific application for which it is intended, and the particular switch components with which the system is intended to be used, and that the specific manufacturing process which is to be used to construct the switch network housing can be selected accordingly, provided that the method and the constructed housing fall within the scope of the invention as defined by the appended claims.

The invention claimed is:

1. A radio frequency (RF) switch network housing, comprising:
    a plurality of switch blocks, each of the switch blocks having a plurality of ports distributed around a perimeter of the switch block and a hollow section adapted to receive a radio frequency switch to selectively couple two of the plurality of ports; and
    one or more interlink waveguides each being arranged to connect two of the plurality of switch blocks to each other via one of the plurality of ports of each of the two switch blocks and not being an interface waveguide connected directly to any housing interface for receiving or transmitting a signal from or to a component external to the housing, and further arranged externally with respect to the two switch blocks;
    wherein at least one of the one or more interlink waveguides is integral with at least one of the two switch blocks.

2. The RF switch network housing according to claim 1, wherein two or more of the switch blocks are arranged in different three-dimensional orientations from each other.

3. The RF switch network housing according to claim 1, further including a base defining a plane, wherein each of the switch blocks includes an integral mounting bracket that is integral with the base.

4. The RF switch network housing according to claim 3, wherein the one of the plurality of ports of each of the two switch blocks connected to each other via one of the one or more interlink waveguides, are in a common plane which is parallel to the plane of the base.

5. The RF switch network housing according to claim 1, further comprising one or more interface waveguides arranged to connect at least one of the plurality of switch blocks to an interface of the housing.

6. A satellite payload comprising the RF switch network housing according to claim 1.

7. A switch network comprising the RF switch network housing according to claim 1, and a plurality of radio frequency switches respectively contained in the plurality of switch blocks, the radio frequency switches arranged to route radio frequency signals selectively through the network.

8. A method of manufacturing an RF switch network housing, comprising steps of:
    forming a plurality of switch blocks so that each switch block has a plurality of ports distributed around a perimeter of the switch block and a hollow section adapted to receive a radio frequency switch to selectively couple two of the plurality of ports; and
    forming one or more interlink waveguides each arranged to connect two switch blocks to each other via one of the plurality of ports of each switch block blocks and not being an interface waveguide connected directly to any housing interface for receiving or transmitting a signal from or to a component external to the housing, and further arranged externally with respect to the two switch blocks;
    wherein the step of forming one or more interlink waveguides includes integrally forming at least one of the interlink waveguides with at least one of the respective two switch blocks.

9. The method according to claim 8, wherein the integrally forming step includes using additive layer manufacturing.

10. The RF switch network housing according to claim 3, further comprising at least one interface waveguide, the interlink and interface waveguides collectively referred to herein as waveguides, wherein projections of shapes of two of the waveguides onto the base intersect.

* * * * *